United States Patent
Lee et al.

(10) Patent No.: US 9,033,472 B2
(45) Date of Patent: May 19, 2015

(54) PIEZO ACTUATOR AND INKJET PRINT HEAD ASSEMBLY HAVING THE SAME

(71) Applicant: SAMSUNG ELECTRO-MECHANICS CO., LTD., Suwon (KR)

(72) Inventors: Tae Kyung Lee, Suwon (KR); Jae Chang Lee, Suwon (KR); Hwa Sun Lee, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 0 days.

(21) Appl. No.: 13/789,019

(22) Filed: Mar. 7, 2013

(65) Prior Publication Data

US 2014/0176645 A1    Jun. 26, 2014

(30) Foreign Application Priority Data

Dec. 21, 2012   (KR) .......................... 10-2012-0151471

(51) Int. Cl.
| | |
|---|---|
| *B41J 2/045* | (2006.01) |
| *H01L 41/08* | (2006.01) |
| *B41J 2/14* | (2006.01) |
| *B41J 2/16* | (2006.01) |
| *H01L 41/09* | (2006.01) |
| *H01L 41/332* | (2013.01) |

(52) U.S. Cl.
CPC ......... *H01L 41/0805* (2013.01); *B41J 2/14201* (2013.01); *B41J 2/1607* (2013.01); *B41J 2/14233* (2013.01); *B41J 2/161* (2013.01); *B41J 2/1623* (2013.01); *B41J 2/1628* (2013.01); *B41J 2/1631* (2013.01); *B41J 2/1632* (2013.01); *B41J 2/1643* (2013.01); *B41J 2002/14403* (2013.01); *B41J 2002/14491* (2013.01); *B41J 2202/18* (2013.01); *H01L 41/0973* (2013.01); *H01L 41/332* (2013.01)

(58) Field of Classification Search
CPC ........ B41J 2/1623; B41J 2/161; B41J 2/1612; B41J 2/164; B41J 2/1618; B41J 2/1626; B41J 2/1628; B41J 2/1629
USPC .................... 347/68, 70, 71; 216/27; 29/25.35
See application file for complete search history.

(56) References Cited

U.S. PATENT DOCUMENTS

| | | |
|---|---|---|
| 8,057,018 B2 * | 11/2011 | Yazaki et al. .................... 347/68 |
| 2004/0246313 A1 | 12/2004 | Lim et al. |
| 2007/0195134 A1 | 8/2007 | Lee et al. |

* cited by examiner

*Primary Examiner* — Alessandro Amari
*Assistant Examiner* — Michael Konczal (57) ABSTRACT

A piezoelectric actuator includes upper and lower electrodes providing driving voltages and a piezoelectric film formed between the upper and lower electrodes and providing a driving force to ink in a plurality of pressure chambers formed on an inkjet print head, respectively. The piezoelectric film may include a plurality of basin parts individually formed on respective tops of the plurality of pressure chambers and a large-area part connected to the plurality of basin parts, respectively, at one end of the plurality of basin parts and formed as a single body. The large-area part may include a groove formed on an extended line of a basin line partitioning the basin parts.

7 Claims, 13 Drawing Sheets

PIEZO ACTUATOR AND INKJET PRINT HEAD ASSEMBLY HAVING THE SAME

CROSS-REFERENCE TO RELATED APPLICATIONS

This application claims the priority of Korean Patent Application No. 10-2012-0151471 filed on Dec. 21, 2012, in the Korean Intellectual Property Office, the disclosure of which is incorporated herein by reference.

BACKGROUND OF THE INVENTION

1. Field of the Invention

The present invention relates to a piezoelectric actuator, an inkjet print head assembly, and a method of manufacturing the piezoelectric actuator and the inkjet print head assembly.

2. Description of the Related Art

In general, inkjet print heads have a structure in which an electric signal is converted into a physical force to allow ink to be ejected as droplets via small nozzles. Inkjet print heads may be classified into two types thereof, according to a method of ejecting ink utilized thereby. One is a thermally driven inkjet print head generating bubbles in ink by using a thermal energy and ejecting the ink by using expansive force of the bubbles, and another is a piezoelectric inkjet print head in which a piezoelectric body is deformed to form pressure to supply ejection force to ink.

Particularly, piezoelectric inkjet print heads are generally used in industrial inkjet printers. For example, piezoelectric inkjet print heads are used to directly form circuit patterns by jetting ink formed of a molten metal such as gold or silver onto a flexible printed circuit board (FPCB), are used to manufacture industrial graphics, liquid crystal displays (LCDs), and organic light emitting diodes (OLED), as well as for solar cells.

Piezoelectric inkjet print heads have a structure in which a piezoelectric actuator is included on a top of an inkjet print head plate including a pressure chamber to apply pressure to ink filling the pressure chamber. In this case, it is necessary to electrode-wire a driving electrode of the piezoelectric actuator to supply a voltage thereto.

Piezoelectric inkjet print heads use films formed by applying and solidifying a piezoelectric liquid in a paste state or piezoelectric films obtained by forming of piezoelectric bodies having a film shape (hereinafter, all referred to as a piezoelectric film, in which a piezoelectric film is formed to have a shape corresponding to a pressure chamber formed to be extended in a longitudinal direction and an upper electrode corresponding to a shape of each of the pressure chambers is included on a top of the piezoelectric film.

In this case, as an inkjet printing technology with high resolution is needed, it is necessary to temper the pressure chamber to embody nozzles having a high degree of integration.

In such situation, it is difficult to connect an FPC to supply power to the upper electrode and also a defect such as a short circuit may occur although being connected.

For this, a technology for preventing the occurrence of such a short circuit by manufacturing a piezoelectric film having a novel shape is provided.

SUMMARY OF THE INVENTION

An aspect of the present invention provides a piezoelectric actuator capable of being easily connected to a flexible printed circuit (FPC) and reducing the incidence of short-circuits, an inkjet print head assembly, and a method of manufacturing the piezoelectric actuator and the inkjet print head assembly.

Another aspect of the present invention provides a piezoelectric actuator capable of reducing a defect ratio by compensating for a disadvantage of exposing a common electrode that is a lower electrode in a process of manufacturing piezoelectric actuators, an inkjet print head assembly using the piezoelectric actuator, and a method of manufacturing the piezoelectric actuator and the inkjet print head assembly.

According to an aspect of the present invention, there is provided a piezoelectric actuator. The piezoelectric actuator includes upper and lower electrodes providing driving voltages and a piezoelectric film formed between the upper and lower electrodes and providing a driving force to ink in a plurality of pressure chambers formed on an inkjet print head, respectively. The piezoelectric film may include a plurality of basin parts individually formed on respective tops of the plurality of pressure chambers and a large-area part connected to the plurality of basin parts, respectively, at one end of the plurality of basin parts and formed as a single body. The large-area part may include a groove formed on an extended line of a basin line partitioning the basin parts.

The groove may be formed to traverse the large-area part in a longitudinal direction.

The upper electrodes may be individually formed, respectively, to be extended from the basin parts to the large-area part.

According to another aspect of the present invention, there is provided an inkjet print head assembly. The inkjet print head assembly includes an inkjet print head plate in which an ink channel is formed and a piezoelectric actuator formed to correspond to pressure chambers in the inkjet print head plate and providing a driving force for ejecting ink from the pressure chambers to the nozzles. The piezoelectric actuator may include upper and lower electrodes providing driving voltages and a piezoelectric film formed between the upper and lower electrodes and providing a driving force to ink in a plurality of pressure chambers formed on an inkjet print head, respectively. The piezoelectric film may include a plurality of basin parts individually formed on respective tops of the plurality of pressure chambers and a large-area part connected to the plurality of basin parts, respectively, at one end of the plurality of basin parts and formed as a single body. The large-area part may include a groove formed on an extended line of a basin line partitioning the basin parts.

The groove may be formed to traverse the large-area part in a longitudinal direction.

The upper electrodes may be individually formed, respectively, to be extended from the basin parts to the large-area part.

According to still another aspect of the present invention, there is provided a method of manufacturing an inkjet print head assembly. The method includes forming an ink channel including a plurality of pressure chambers in an inkjet print head plate, sequentially forming a preliminary lower electrode, a preliminary piezoelectric film, and a preliminary upper electrode on a top of the inkjet print head plate, forming a first resist corresponding to a shape of a final piezoelectric film including a plurality of basin parts formed to correspond to the plurality of pressure chambers and a large-area part connected to the plurality of basin parts, respectively, and formed as a single body, on a top of the preliminary upper electrode, etching a part not covered by the first resist to leave a part of the preliminary piezoelectric film and removing the first resist, forming a second resist corresponding to a shape of a final upper electrode, on the top of the preliminary upper electrode, and etching a part not covered by the second resist to a thickness of the preliminary upper electrode and removing the second resist.

A relative thickness of the preliminary piezoelectric film left in the etching the part not covered by the first resist may be the same as or greater than a relative thickness of the preliminary upper electrode etched in the etching the part not covered by the second resist.

In the etching the part not covered by the second resist, the preliminary piezoelectric film left in the etching the part not covered by the first resist may be entirely etched.

In the etching the part not covered by the second resist, a part of the preliminary piezoelectric film for forming the large-area part may be partially etched.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. However, the scope of the present invention is not limited to exemplary embodiments described below. A person skilled in the art, understanding the thought of the present invention, may easily provide another example that is included in regressive other inventions or the scope of the present invention by adding, changing, and deleting other elements within the scope of the present invention, which may be understood as included in the scope of the present invention.

Also, in the drawings, like reference numerals designate like elements throughout the description.

Figure 1:
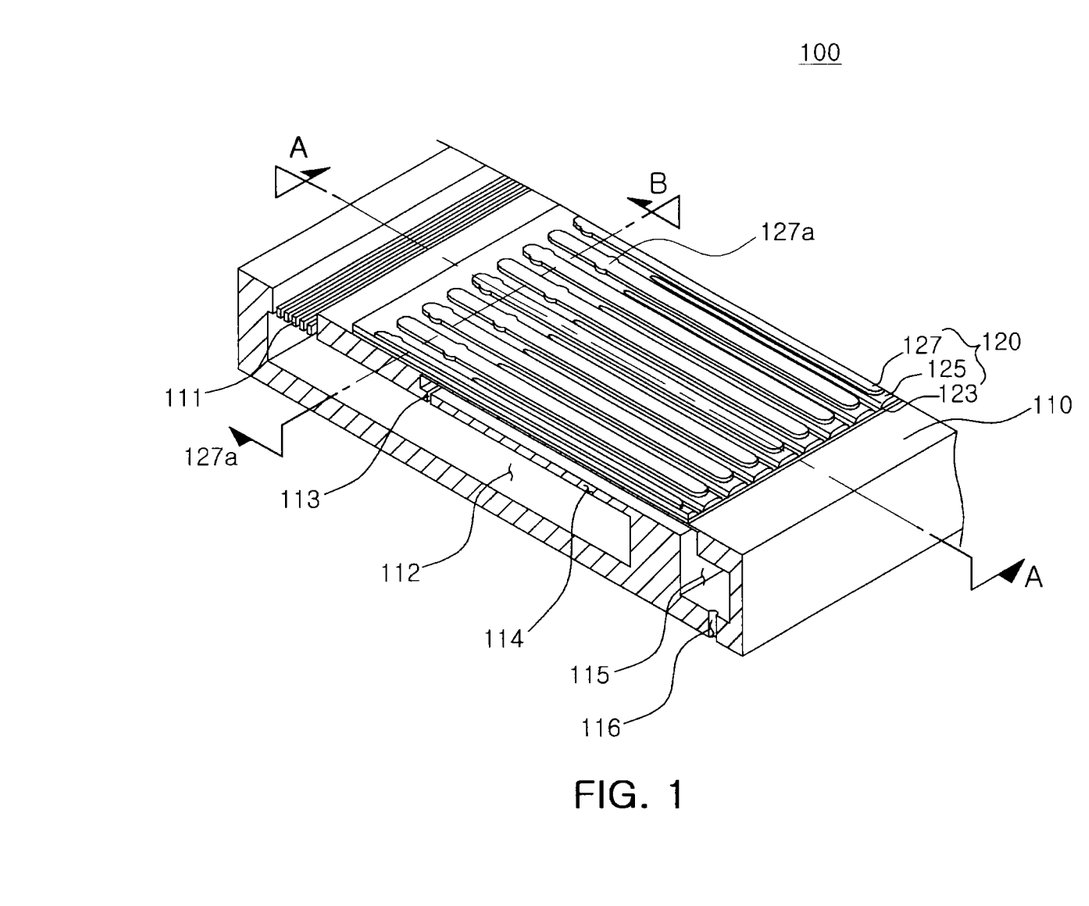
FIG. 1 is a schematic incised-perspective view illustrating an inkjet print head assembly according to an embodiment of the present invention.
Figure 2A:
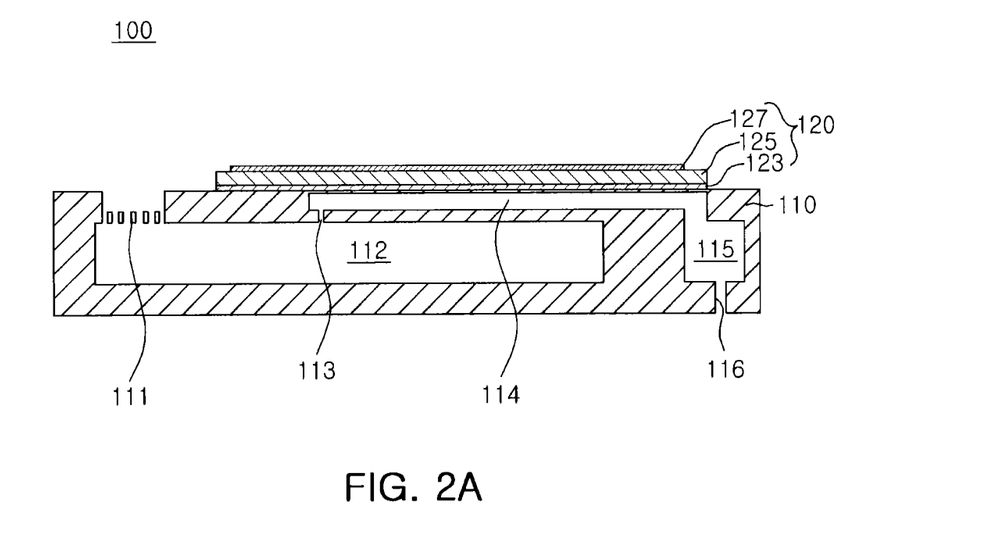
FIGS. 2(a) and 2(b) are a schematic longitudinal cross-sectional view (A-A) and a lateral cross-sectional view (B-B) illustrating the inkjet print head assembly of FIG. 1.
Figure 2B:
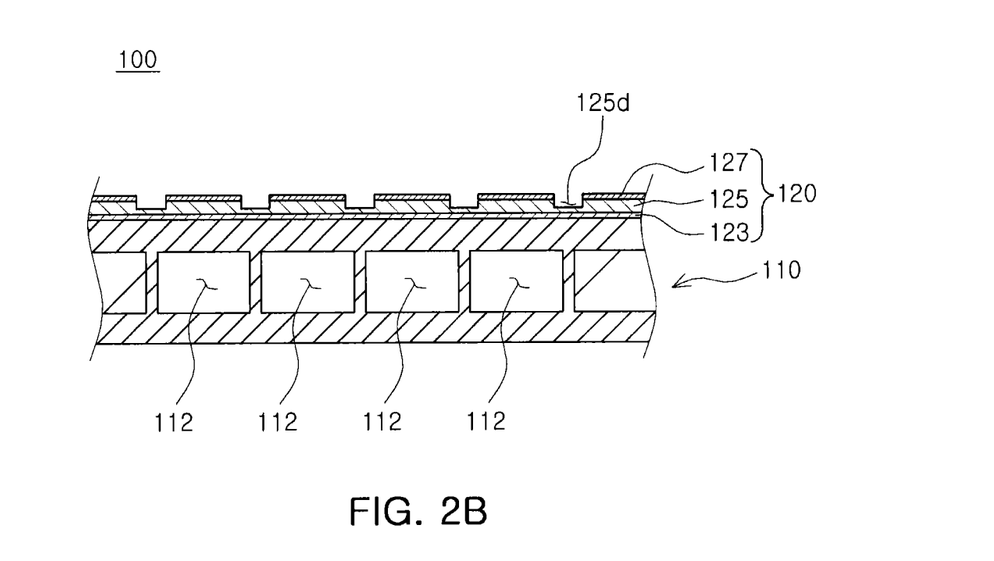
Figure 3:
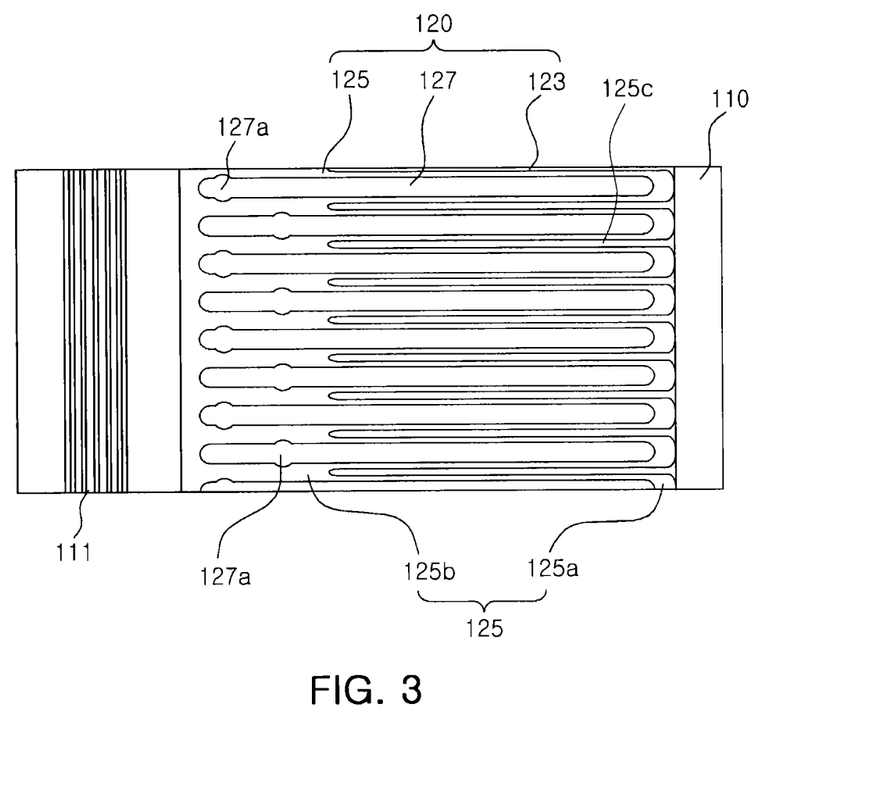
FIG. 3 is a schematic top view illustrating the inkjet print head assembly of FIG. 1.

FIG. 1 is a schematic incised-perspective view illustrating an inkjet print head assembly 100 according to an embodiment of the present invention, FIGS. 2(a) and 2(b) are a schematic longitudinal cross-sectional view (A-A) and a lateral cross-sectional view (B-B) illustrating the inkjet print head assembly 100, and FIG. 3 is a schematic top view illustrating the inkjet print head assembly 100.

Referring to FIGS. 1 to 3, the inkjet print head assembly 100 may include an inkjet print head plate 110 in which an ink channel is formed and a piezoelectric actuator 120 providing a driving force to the inkjet print head plate 110 to eject ink.

The inkjet print head plate 110 may include an ink inlet 111 through which ink enters, a reservoir 112 storing the ink entering through the ink inlet 111, a plurality of pressure chambers 114 provided below a location on which the piezoelectric actuator 120 is mounted, and a plurality of nozzles 116 ejecting the ink. Between the reservoir 112 and the pressure chambers 114, to restrict a backflow of the ink in the pressure chambers 114 to the reservoir 112 while ejecting the ink, a plurality of restrictors 113 may be formed. Also, the pressure chambers 114 and the nozzles may be connected to one another by a plurality of dampers 115.

The inkjet print head plate 110 may be formed by properly forming elements forming the ink channel on an upper substrate and a lower substrate and bonding the upper plate and lower plate to each other by using a silicon direct bonding (SDB) method. In this case, the upper substrate may be a single crystal silicon substrate or a silicon on insulator (SOI) substrate and the lower substrate may be formed of an SOI substrate. Also, the inkjet print head plate 110 is not limited thereto, and the ink channel may be formed of more substrates or may be embodied by one substrate if necessary. The elements forming the ink channel are also merely exemplary, and ink channels having various configurations may be provided according to necessary condition and design options.

The piezoelectric actuator 120 is formed on a top of the inkjet print head plate 110 to correspond to the pressure chambers 114 of the inkjet print head plate 110 and provides the driving force to eject the ink entering the pressure chambers 114 to the nozzles 116. For example, the piezoelectric actuator 120 may include a lower electrode 123 that functions as a common electrode, a piezoelectric film 125 deformed according to supply of a voltage, and a plurality of upper electrodes 127 that function as driving electrodes.

The lower electrode 123 may be formed on the entire surface of the inkjet print head plate 110 and may be formed of a conductive metal, and particularly, may be formed of two thin metal films formed of titanium (Ti) and platinum (Pt). The lower electrode 123 not only functions as the common electrode but as a diffusion barrier layer preventing mutual diffusion between the piezoelectric film 125 and the inkjet print head plate 110.

The piezoelectric film 125 may be formed on the lower electrode 123 and be one of a film formed by solidifying a piezoelectric liquid in a paste state and a piezoelectric film obtained by forming a piezoelectric body in a film shape. The piezoelectric film 125 may include a plurality of basin parts 125a individually provided on tops of the plurality of pressure chambers 114, respectively, and a large-area part 125b connected to the plurality of basin parts 125a on one end of the plurality of basin parts 125a, respectively, but formed as a single body. That is, on the top of the pressure chambers 114, overall, the piezoelectric film 125 formed approximately in a head of a fork including the basin parts 125a individually sunk and the large-area part 125b entirely connected in other parts may be formed.

On the other hand, the large-area part 125*b* may include an etched groove 125*d* formed on an extended line of a basin line 125*c* partitioning the basin parts 125*a*. That is, the etched groove 125*d* may be included between the large-area part 125*b* and the upper electrodes 127 in a longitudinal direction. It will be described below with reference to FIGS. 11(*a*) to 11 (*e*).

In the present embodiment, the large-area part 125*b* is included on the piezoelectric film 125. That is, the large-area parts 125*b* having a large area are formed on the piezoelectric film 125 and a flexible printed circuit (FPC) is connected to the upper electrodes 127 formed on a top of the large-area part 125*b*, which are driving electrodes, thereby preventing the occurrence of short-circuits and allowing a reliable and strong connection.

The piezoelectric film 125 may be formed of a piezoelectric material, and more particularly, a lead zirconate titanate (PZT) ceramic material. Also, as described above, the piezoelectric film 125 may be one of a piezoelectric body film and a film obtained by applying and solidifying a piezoelectric liquid in a paste state.

The upper electrodes 127 may be formed on the piezoelectric film 125 and be formed of a material such as Pt, Au, Ag, Ni, Ti, Cu, etc. The upper electrodes 127 may be individually formed to be extended from the basin parts 125*a* to the large-area part 125*b*. That is, the upper electrodes 127 may be not connected to one another and formed to have a number correspond to the respective pressure chambers 114 to function as a driving electrode for each of the pressure chambers 114.

In this case, on parts of the upper electrodes 127 located on the top of the large-area part 125*b*, a plurality of connection parts 127*a* having a greater width than other parts to be wired to supply a voltage may be formed. The connection parts 127*a* are to allow a connection between the upper electrodes 127 and an FPC 165 to be more definite, which may provide a much broader connection area to a part at which the upper electrodes 127 are connected to the FPC 165.

Also, the connection parts 127*a* may be formed in different locations in a longitudinal direction from the plurality of upper electrodes 127. That is, on the respective upper electrodes 127, locations of the connection parts 127*a* are different in such a way that a short circuit between the part having the broader width and adjacent ones of the upper electrodes 127 may be prevented. In more detail, the connection parts 127*a* may be formed to be disposed in a zigzag manner on the plurality of upper electrodes 127.

Figure 4:
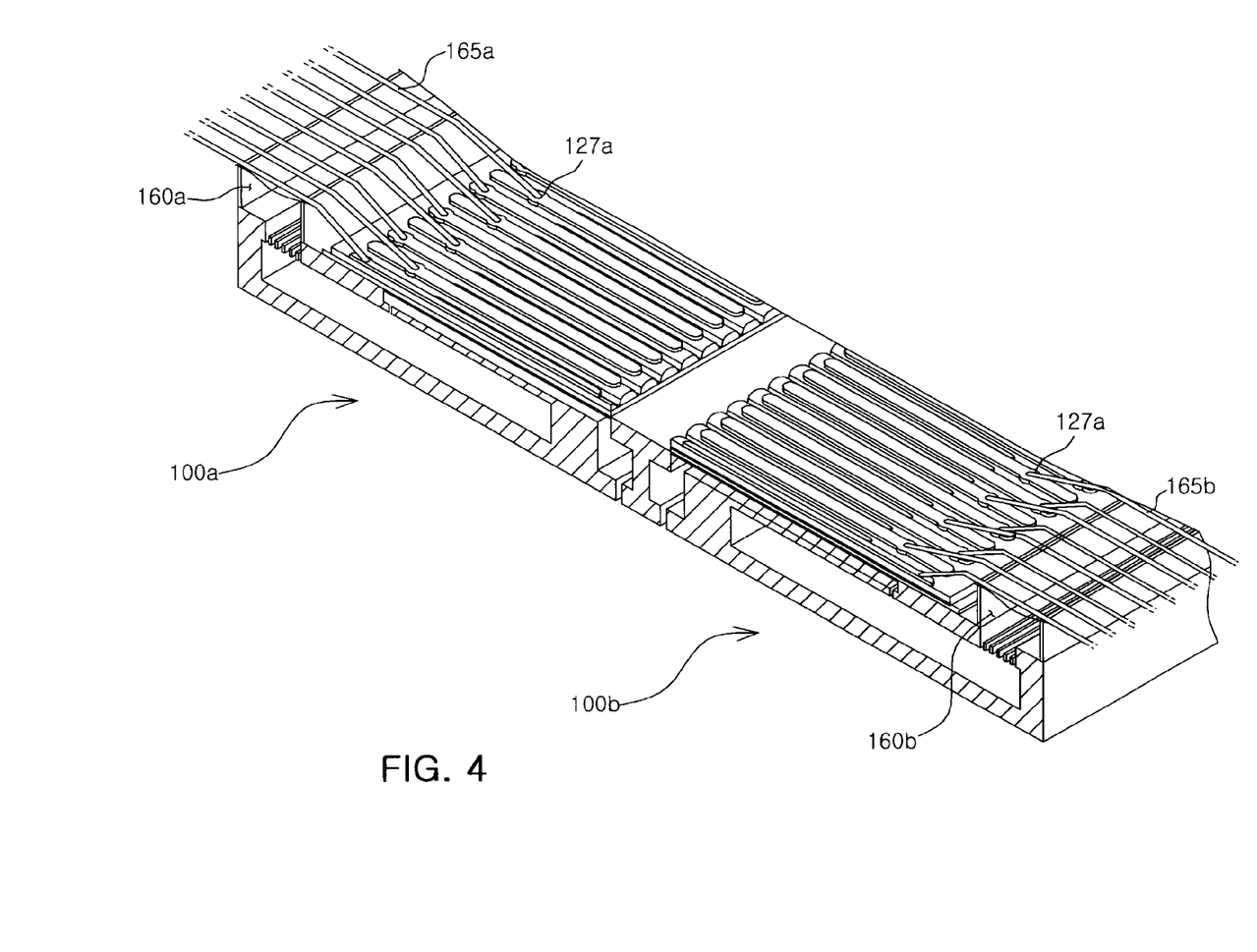
FIG. 4 is a schematic perspective view illustrating a mounting structure for inkjet print head assemblies according to an embodiment of the present invention.

FIG. 4 is a schematic perspective illustrating a mounting structure for inkjet print head assemblies according to an embodiment of the present invention.

Referring to FIG. 4, the mounting structure for the inkjet print head assembly 100 includes a first inkjet print head assembly 100*a*, a second inkjet print head assembly 100*b*, ink storage tanks 160*a* and 160*b* disposed on both end portions of the first and second inkjet print head assemblies 110*a* and 100*b*, and FPCs 165*a* and 165*b* connected to the upper electrodes 127 of the first and second inkjet print head assemblies 100*a* and 100*b*.

In the present embodiment, as described above, connection parts 127*a* are formed on the upper electrodes 127 and parts of the piezoelectric film 125, to which the FPCs 165*a* and 165*b* are connected, are formed to be planar in such a way that the upper electrodes 127 formed on tops thereof are formed to be even, thereby allowing a connection between the FPCs 165*a* and 165*b* and the upper electrodes 127 not only to be easily formed but also to be definite and strong.

On the other hand, since the inkjet print head assembly according to an embodiment of the present invention includes an ink storage tank provided for each of the first and second inkjet print head assemblies 100*a* and 100*b*, two ink storage tanks generally disposed to the left and right are needed. Considering miniaturization and lightening, there is provided an inkjet print head assembly 100' including only one ink storage tank according to another embodiment of the present invention.

This corresponds to adding a package part 130 that will be described below to the inkjet print head plate 110 and the piezoelectric actuator 120 of the inkjet print head assembly 100 according to an embodiment of the present invention. Hereinafter, the package part 130 will be described in detail.

Figure 5:
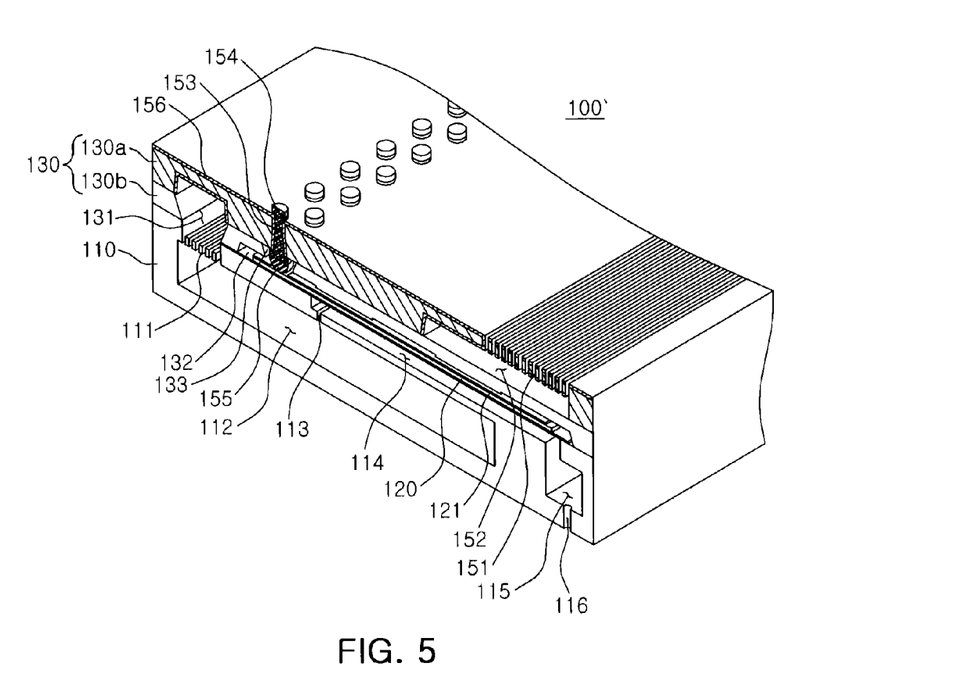
FIG. 5 is a schematic incised-perspective view illustrating an inkjet print head assembly according to another embodiment of the present invention.
Figure 6:
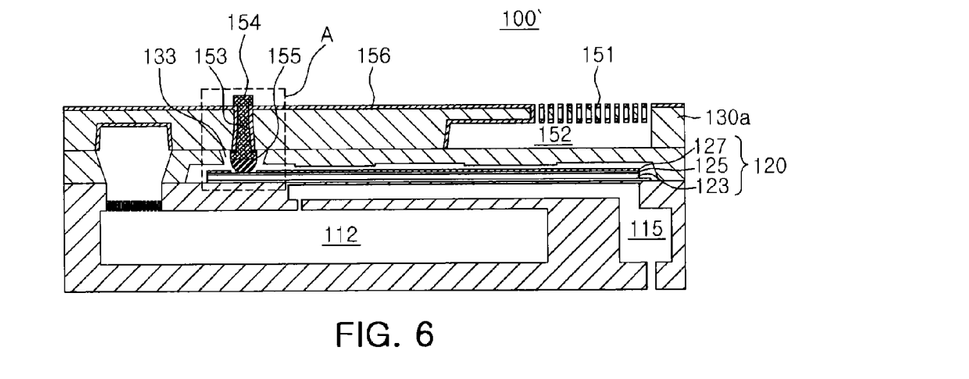
FIG. 6 is a schematic cross-sectional view illustrating the inkjet print head assembly of FIG. 5.
Figure 7:
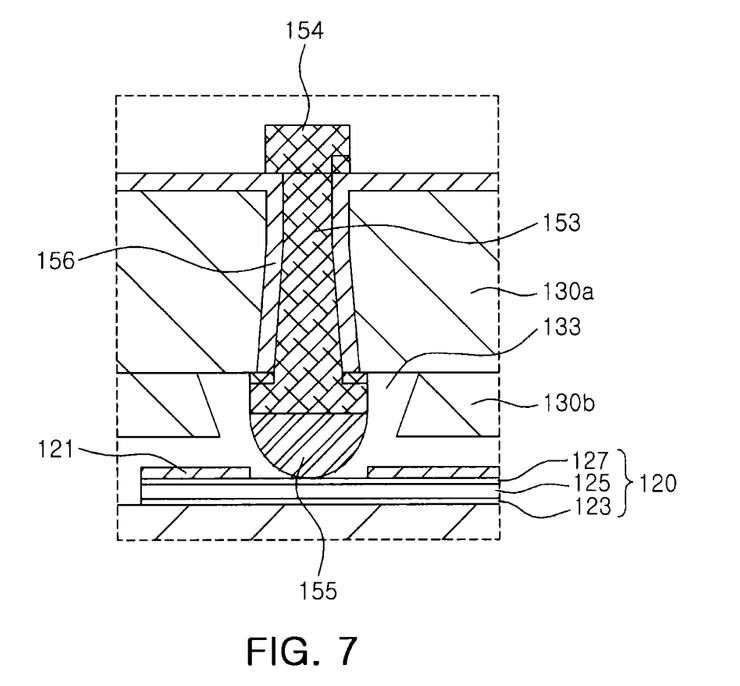
FIG. 7 is a schematic cross-sectional view illustrating a portion (A) of the inkjet print head assembly of FIG. 6.

FIG. 5 is a schematic incised-perspective view illustrating the inkjet print head assembly 100' according to another embodiment of the present invention, FIG. 6 is a schematic cross-sectional view illustrating the inkjet print head assembly 100', and FIG. 7 is a schematic top view illustrating the inkjet print head assembly 100'.

Referring to FIGS. 5 to 7, the package part 130 may include a channel-formed layer 130*a* in which an ink channel is formed to transfer ink supplied from an ink storage tank (not shown) to an ink inlet 111 of an inkjet print head plate 110 and an intermediate layer 130*b* for bonding the package part 130 and the inkjet print head plate 110 to each other. The package part 130 may be formed of a silicon wafer, in which the channel-formed layer 130*a* may be formed of a single crystal silicon wafer, the intermediate layer 130*b* may be formed of a glass wafer, and bonding between the channel-formed layer 130*a* and the intermediate layer 130*b* may be performed by anodic bonding, glass frit bonding, or the like.

This configuration of the package part 130 is just exemplary, and the package part 130 may be formed of one of a single silicon wafer, a silicon wafer including more layers, and an SOI wafer, which may be changed variously if necessary. The configurations of the channel-formed layer 130*a* and the intermediate layer 130*b* are also just exemplary. The intermediate layer 130*b* may be formed of a silicon wafer in such a manner that the channel-formed layer 130*a* and the intermediate 130*b* may be bonded to each other by one of direct silicon bonding and eutectic bonding, which may be changed variously in design.

The channel-formed layer 130*a* may include an ink inlet 151 through which ink supplied from the ink storage tank enters, an ink transfer part 152 functioning as a channel for transferring the ink to the inkjet print head plate 110, and a via 153 applying a voltage to an piezoelectric actuator 120. The via 153 may be formed to penetrate top and bottom surfaces of the channel-formed layer 130*a* and be disposed on one side of a top of the piezoelectric actuator 120. In this case, the ink inlet 151 may be formed opposite to the via 153. Accordingly, in the mounting structure for the inkjet print head assembly, the ink storage tank may be disposed in the middle of arranged assemblies and electric wiring may be connected to a side end portion of the inkjet print head assembly, thereby reducing a mounting area of the inkjet print head assembly.

The ink inlet 151, the ink transfer part 152, and the via 153 may be formed by performing an etching process on a silicon wafer, and particularly, the via 153 may be formed to be a vertical hole having a certain diameter by performing a dry etching process or be formed in a shape having a diameter gradually increasing toward a bottom of the channel-formed layer 130*a*, the shape having an inclined side. The dry etching process may include one of a reactive-ion etching (RIE) process and a deep RIE process (DRIE). The via 153 is filled with metal for electric wiring to form an electric connection part 154.

The electric connection part 154 may be formed by plating the via 153 with metal by using an electroplating method. As the metal used herein may be one of Pt, Au, Ag, Ni, Ti, and Cu. The electric connection part 154 may have a top and a bottom whose circumferences are greater than the via 153 to ensure an electric connection and may have a cross section in the shape of an I-beam. The cross section of the electric connection part 154 is not limited thereto and may have one of shapes of 1 and T, in addition thereto. Also, a side of the electric connection part 154 may be vertically formed or formed to be inclined to correspond to the shape of the via 153.

The electric connection part 154 may include a connecting element 155 on a bottom thereof to be connected to the piezoelectric actuator 120. The connecting element 155 may be formed of a current carrying medium having a bonding force not to be electrically short-circuited and be formed of a projection type connecting element such as a solder ball and a solder bump and an anisotropic conductive film (ACF). In addition, various weight-applying current-carrying media may be used. In the present embodiment, the connecting element 155 may be designated as a solder ball. The connecting element 155 may be connected to the connection part 127a of the upper electrode 127 as described above.

When performing a reflow soldering process for bonding the solder ball 155 to the piezoelectric actuator 120, to prevent an overflow of solder, a polymer film 121 may be applied onto a top surface of the piezoelectric actuator 120. In this case, the polymer film 121 may be formed on the top surface of the piezoelectric actuator 120 except a bonding part for the solder. The polymer film 121 may be formed by developing a material such as a photoresist.

An oxide film 156 may be formed on a top surface of the channel-formed layer 130a, a surface thereof in which the via 153 is formed, and a surface thereof in which the ink transfer part 152 is formed. The oxide film 156 functions to prevent diffusion of impurities included in a silicon crystal of the channel-formed layer 130a formed of the silicon wafer. The oxide film 156 may be formed by oxidizing silicon of the channel-formed layer 130a to be epitaxially deposited on the surface of the channel-formed layer 130a and then removing an oxide film formed on a bottom surface of the channel-formed layer 130a by performing a chemical mechanical polishing (CMP) process.

The intermediate layer 130b may include a path 131 supplying the ink from the ink transfer part 152 of the channel-formed layer 130a to the ink inlet 116 of the inkjet print head plate 110, a containing part 132 containing the top of the piezoelectric actuator 120, and a connection hole 133 connecting the containing part 132 and the via 153 to each other. The containing part 132 of the piezoelectric actuator 120 may be formed of a groove dented from a bottom of the intermediate layer 130b toward a top thereof, have a shape corresponding to the piezoelectric actuator 120, and be formed to a depth obtained by adding a thickness of the piezoelectric actuator 120 to a processing error. The containing part 132 and the connection hole 133 may be formed by performing one of sand blasting process and an etching process on a glass wafer.

The package part 130 formed by anodic bonding between the channel-formed layer 130a and the intermediate layer 130b is deposited and bonded onto a top of the inkjet print head plate 110. In detail, the bottom of the intermediate 130b and the top of the inkjet print head plate 110 are bonded by performing one of the anodic bonding process and the glass frit bonding process, in which the connecting element 155 of the electric connection part 154 is bonded to the top of the piezoelectric actuator 120. In the present embodiment, a bonding part on an edge supports the bonding between the inkjet print head plate 110 and the package part 130.

As described above, in the present embodiment, since the inkjet print head plate 110 and the package part 130 are bonded to each other at a wafer level, the inkjet print head assembly 100' may have improved productivity such as an increased processing yield and reduced manufacturing costs.

Figure 8:
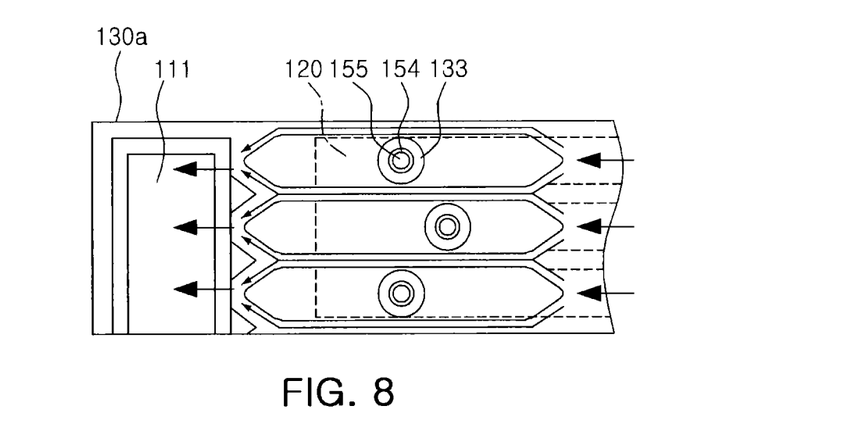
FIG. 8 is a schematic top view illustrating an ink channel of a package part of the inkjet print head assembly of FIG. 5.
Figure 9:
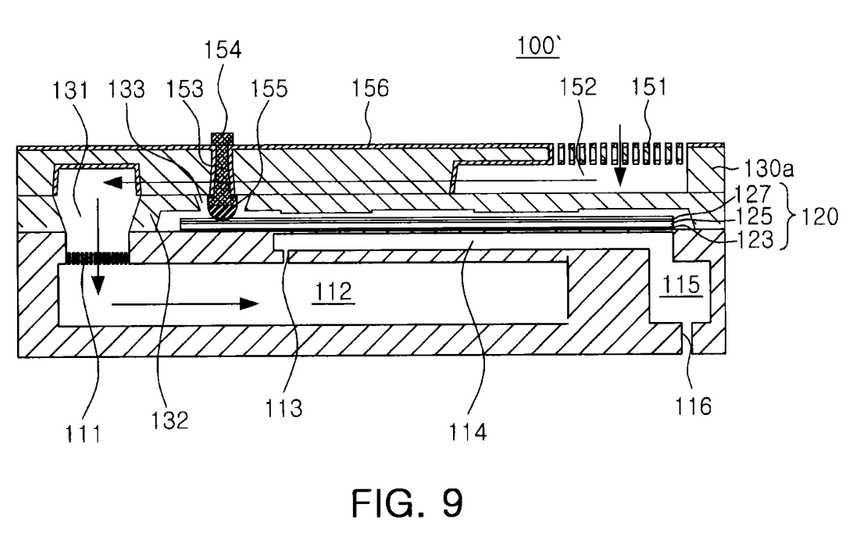
FIG. 9 is a cross-sectional view illustrating the ink channel of the inkjet print head assembly of FIG. 5.

FIG. 8 is a schematic top view illustrating an ink channel of the package part 130 of the inkjet print head assembly 100', and FIG. 9 is a cross-sectional view illustrating the ink channel of the inkjet print head assembly 100'.

Referring to FIGS. 8 and 9, the ink entering the ink inlet 151 from the ink storage tank is transferred to the ink transfer part 152 according to an arrow direction. In this case, the ink is transferred to between walls in which the via 153 for being filled with the electric connection part 154 is formed and then transferred from an end of the ink transfer part 152 to the ink inlet 111 of the inkjet print head plate 110 via the path 131 of the intermediate layer 130b.

Although a transfer path of the ink entering through the inkjet print head plate 110 via the ink inlet 111 is not shown but is substantially identical to an ink flow path of a general inkjet print head. That is, the ink entering the ink inlet 111 is transferred to the pressure chambers 114 via the plurality of restrictors 113 from the reservoir 112. The ink in the pressure chambers 114 is ejected from the nozzles 116 to the outside via the plurality of dampers 115, which is driven by the piezoelectric actuator 120.

When the inkjet print head assembly 100' operates, the ink supplied from the ink storage tank via the ink inlet 151 is transferred according to the arrows shown in FIGS. 8 and 9 and supplied to the inside of each of the plurality of pressure chambers 114 of the inkjet print head plate 110. While the ink fills the inside of the pressure chambers 114, when a voltage is applied to the piezoelectric actuator 120 via the electric connection part 154 connected to an FPCB (not shown), the piezoelectric film 125 is deformed, thereby bending the top of the inkjet print head plate 110 functioning as a vibrating plate downwardly. Due to the bending of the top of the inkjet print head plate 110, the volume of the pressure chambers 114 is reduced. Due to an increase of pressure inside the pressure chambers 114 according thereto, the ink in the pressure chambers 114 is ejected outward via the nozzles 116.

When the voltage applied to the piezoelectric actuator 120 is cut off, the piezoelectric film 125 is restored in such a way that the top of the inkjet print head plate 110 is restored, thereby increasing the volume of the pressure chambers 114. Accordingly, due to a decrease in pressure inside the pressure chambers 114 and surface tension of meniscus of the ink, formed inside the nozzles 116, the ink enters the pressure chambers 114 from the reservoir 112.

Figure 10:
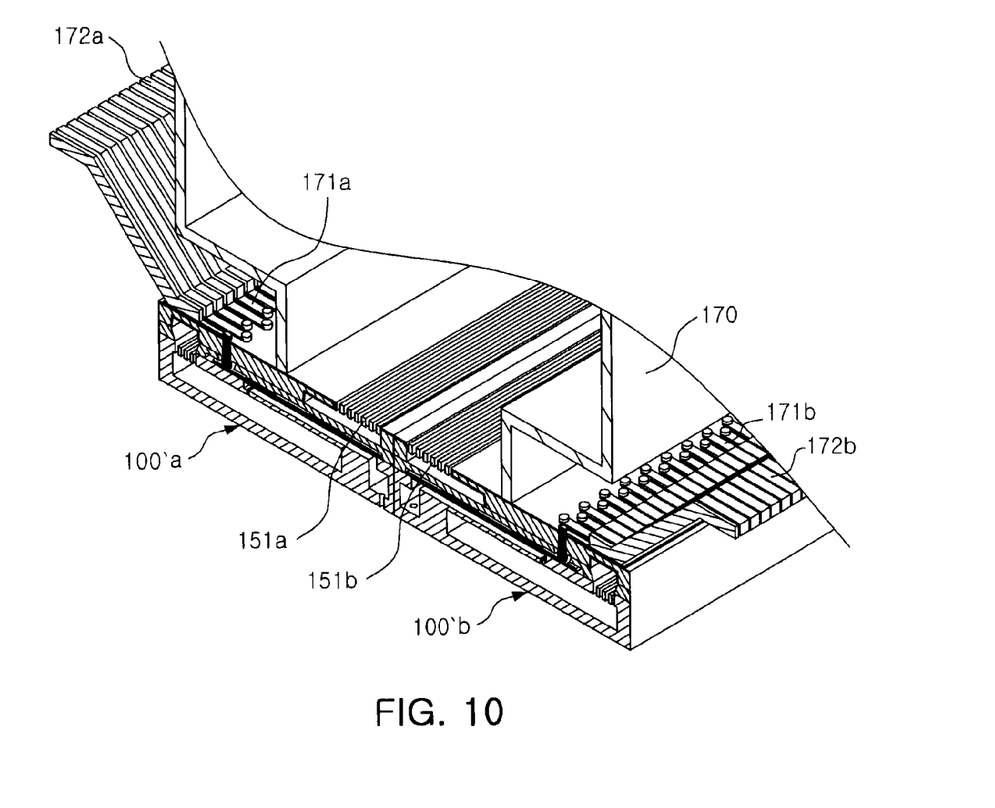
FIG. 10 is a schematic perspective view illustrating a mounting structure for inkjet print head assemblies according to another embodiment of the present invention.

FIG. 10 is a schematic perspective view illustrating a mounting structure for the inkjet print head assembly 100'.

Referring to FIG. 10, the mounting structure for the inkjet print head assembly 100' includes a first inkjet print head assembly 100'a and a second inkjet print head assembly 100'b arranged to be symmetrical with regard to each other, an ink storage tank 170 disposed on the middle of tops of the first and second inkjet print head assemblies 100'a and 100'b, bonding parts 171a and 171b formed on the tops of the first and second inkjet print head assemblies 100'a and 100'b, respectively, and connected to electric connection part 154a and 154b, and FPCBs 172a and 172b connected to the bonding parts 171a and 171b to apply voltages to the piezoelectric actuators 120 of the first and second inkjet print head assemblies 100'a and 100'b. The bonding parts 171a and 171b may be formed of epoxy resin, and more particularly, be formed of an ACF.

As described above, the inkjet print head assembly according to an embodiment of the present invention, electric wiring for applying a voltage to the piezoelectric actuator 120 is connected via the electric connection part 154 approximately vertically formed on the surface of the inkjet print head assembly 100, thereby notably reducing the volume of the inkjet print head assembly, needed for bonding a general FPCB. Accordingly, the inkjet print head assembly according to the present embodiment is reduced in the entire volume by an area for bonding an FPCB and an area for an ACF in the entire width of a general inkjet print head assembly. In this case, the ink storage tank is disposed in the middle of a top of a set of the inkjet print head assemblies in symmetrical structures in which nozzles are alternately formed, thereby notably reducing a mounting area for the inkjet print head assemblies.

The reduction in the mounting area of the inkjet print head assembly causes a notable reduction of the entire width of an inkjet print head assembly formed as a wafer-level package, thereby manufacturing a larger number of inkjet print head assemblies per wafer. Accordingly, productivity is improved such as an increased processing yield and a reduction in manufacturing costs.

FIGS. 11(a) to 11(e) are views sequentially illustrating a process of manufacturing an inkjet print head assembly according to an embodiment of the present invention.

Figure 11A:
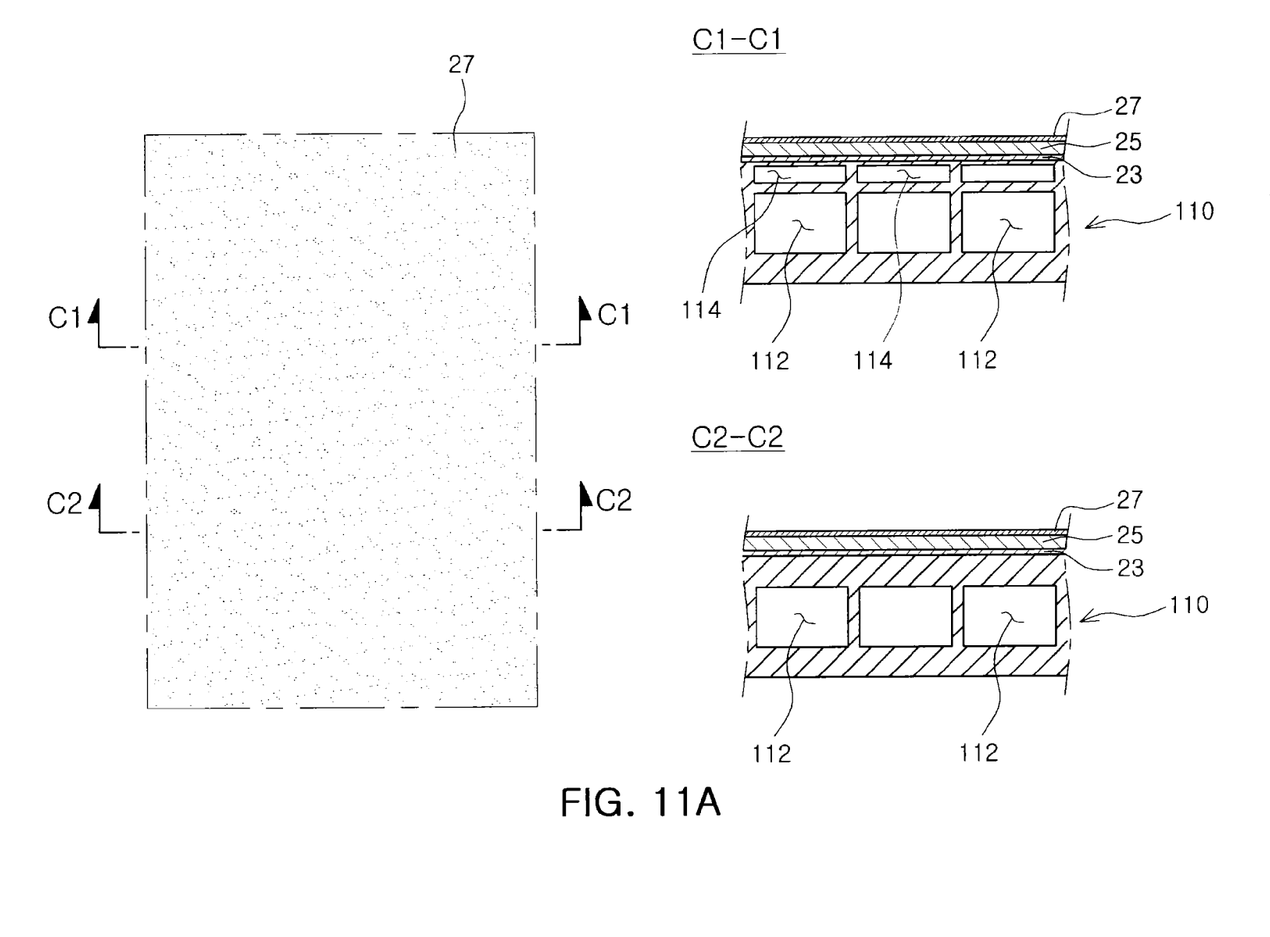
FIGS. 11(a) to 11(e) are views sequentially illustrating a process of manufacturing an inkjet print head assembly according to an embodiment of the present invention.

The inkjet print head plate 110 having an ink channel including the plurality of pressure chambers 114 is prepared, and a preliminary lower electrode 23, a preliminary piezoelectric film 25, and a preliminary upper electrode 27 are sequentially formed on a top of the inkjet print head plate 110 (please refer to FIG. 11(a)). In this case, the preliminary lower electrode 23, the preliminary piezoelectric film 25, and the preliminary upper electrode 27 may be formed on the top of the inkjet print head plate 110 with no certain shapes. On the other hand, since the preliminary lower electrode 23, the preliminary piezoelectric film 25, and the preliminary upper electrode 27 are in an incomplete state, "preliminary" is attached thereto, respectively. Also, although three of the pressure chambers 114 are shown in the drawings, it is merely exemplary and the number of the pressure chambers 114 may be greater or smaller.

Figure 11B:
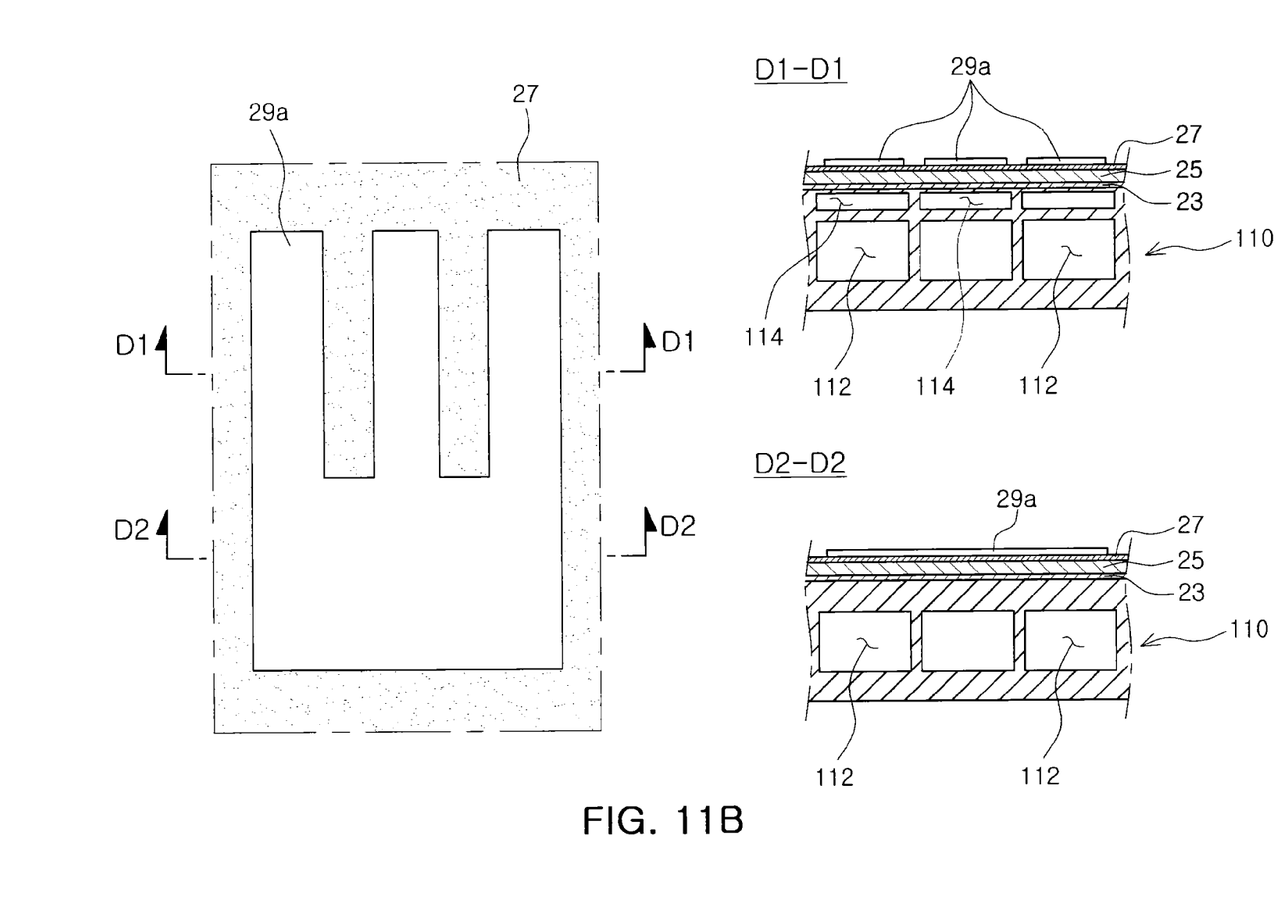

A first resist 29a corresponding to a shape of a final piezoelectric film including the plurality of basin parts 125a corresponding to the respective pressure chambers 114 and the large-area part 125b formed as a single body and connected to the plurality of basin parts 125a, respectively, at one end thereof is formed on a top of the preliminary upper electrode 27 (please refer to FIG. 11(b)). In the present embodiment, the first resist 29a and a second resist 29b to be described below are sacrificial layers formed to protect parts not to be etched while forming the piezoelectric actuator 120 by etching. One of the first resist 29a and the second resist 29b may be one of a photoresist and a dry film resist (DFR).

A part not covered by the first resist 29a is etched while leaving a part of the preliminary piezoelectric film 25, and the first resist 29a is removed (refer to FIG. 11 (c)). That is, in the part not covered by the first resist 29a, the preliminary upper electrode 27 is entirely removed and the preliminary piezoelectric film 25 below is partially removed to leave a residual piezoelectric film 25a. In this case, the etching process may be one of a photolithographic process, an RIE process, and more particularly, a DRIE process, a dry or wet etching process, and a sand blasting process.

Figure 11C:
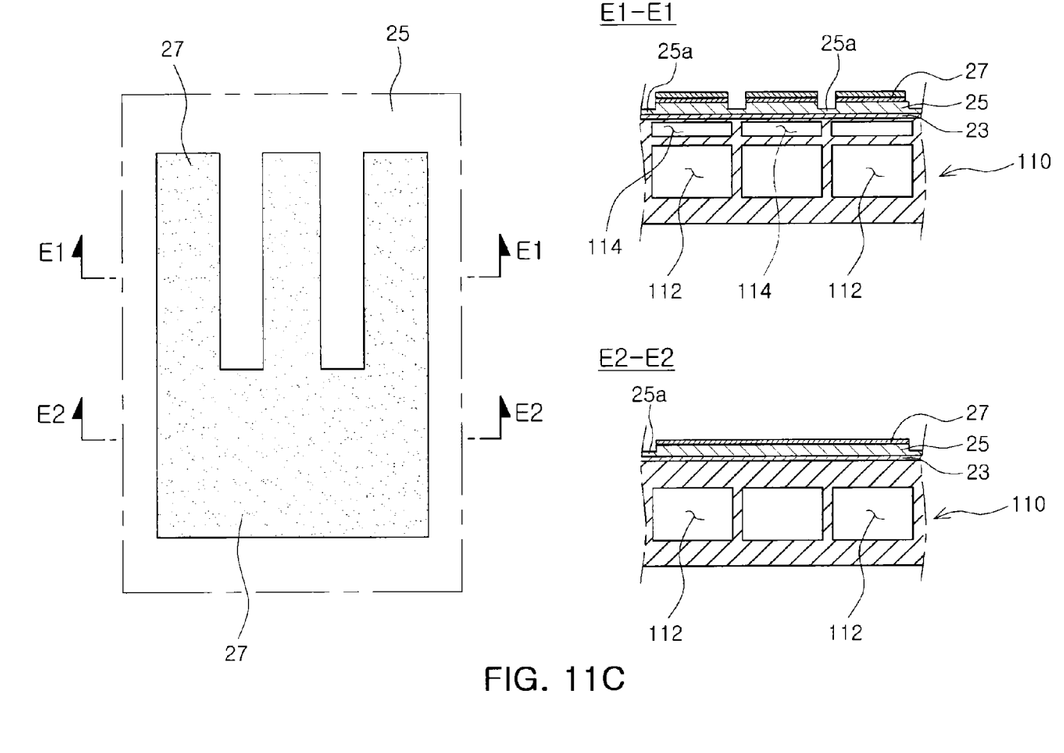

On the other hand, a relative thickness of the residual piezoelectric film 25a left in the etching the part not covered by the first resist 29a is the same as or greater than a relative thickness of the preliminary upper electrode 27 etched while etching a part not covered by the second resist 29b. That is, when etching the residual piezoelectric film 25a and the preliminary upper electrode 27 in the same condition at the same time, the etching of the preliminary upper electrode 27 may be completed first. Also, the etching may stop when the etching of the preliminary upper electrode 27 is completed. Accordingly, the preliminary lower electrode 23 located below the residual piezoelectric film 25a may not be etched.

In this case, the relative thickness designates degrees of etching elements formed of different materials while etching the elements in the same condition. For example, when an etching process is performed in the same condition by using the same method and a preliminary piezoelectric film and a preliminary upper electrode are entirely etched at the same time in a thickness direction, relative thicknesses thereof may be considered as the same. Also, when an etching process is performed in the same condition by using the same method and a preliminary piezoelectric film is entirely etched in a thickness direction but a preliminary upper electrode is partially etched and a part is not etched, it may be understood that a relative thickness of the preliminary upper electrode is greater than a relative thickness of the preliminary piezoelectric film.

Figure 11D:
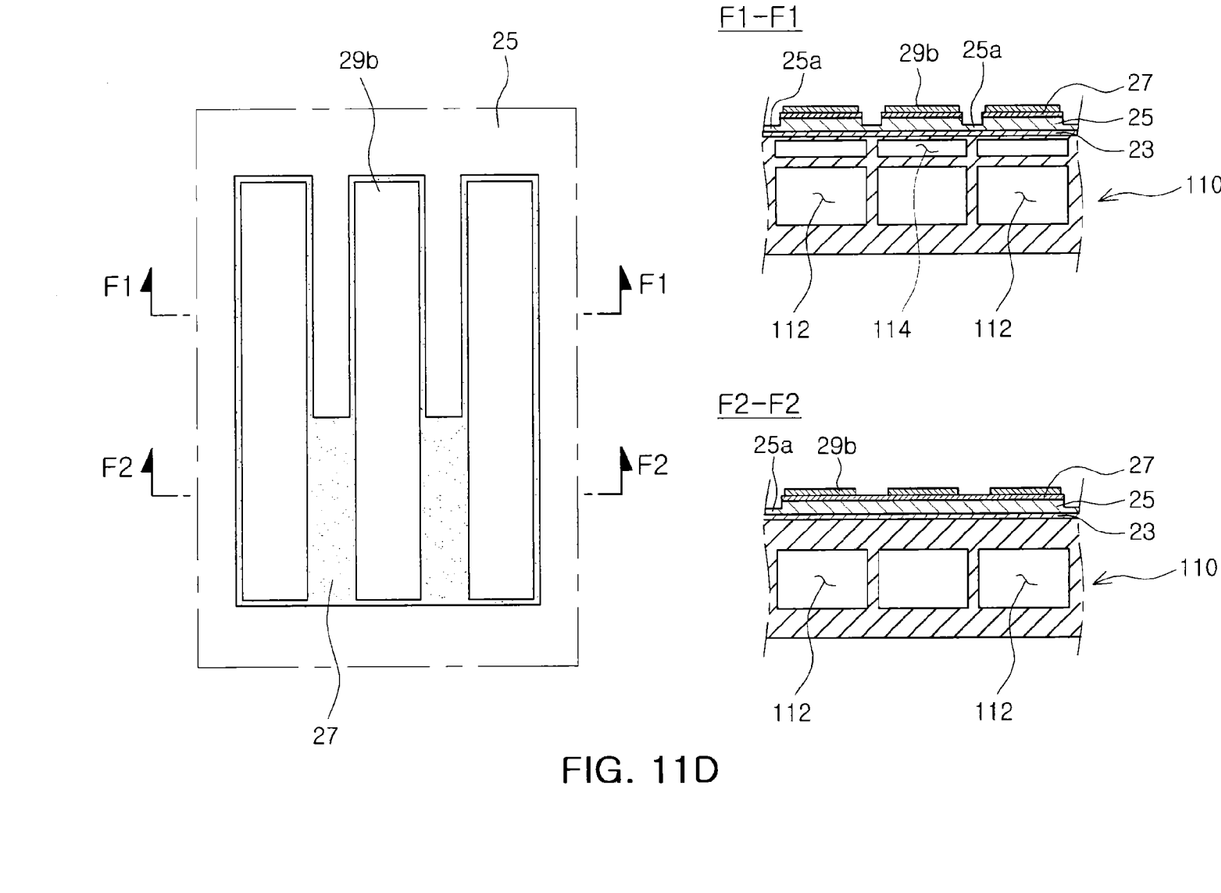

The second resist 29b corresponding to a shape of a final upper electrode is formed on the top of the preliminary upper electrode 27 (refer to FIG. 11(d)). In this case, the second resist 29b may be formed to be extended in a longitudinal direction according to the pressure chambers 111 while considering the shape of the upper electrode 127 that will be formed later. The second resist 29b may be formed to be plural and separate with a certain distance in a widthwise direction according to the number of the pressure chambers 114. Also, the second resist 29b may have a smaller width than a width of the preliminary upper electrode 27 formed on a top of a part that will be a basin part 125a later. When an etching process is later performed, since a part of the preliminary upper electrode 27, on which the second resist 29b is not formed, is entirely etched and then a part of the preliminary piezoelectric film 25 may be etched, a step 125e may be formed in a widthwise direction on the basin part 125a of the piezoelectric film 125 that will be finally formed later. This may be applied to an end 125f of the large-area part 125b of the piezoelectric film 125 in a widthwise direction.

Figure 11E:
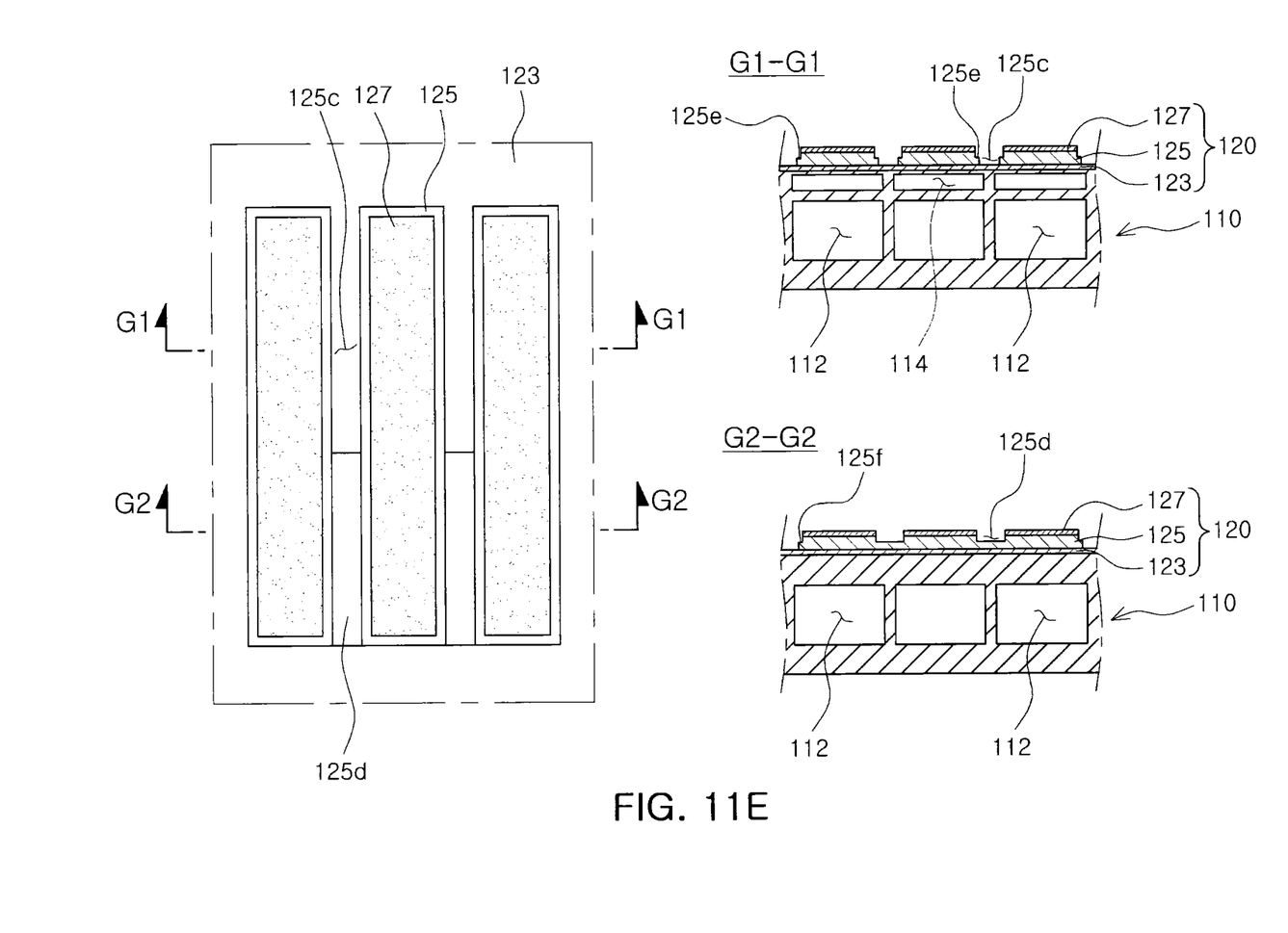

The part not covered by the second resist 29b is etched to the thickness of the preliminary upper electrode 27, and the second resist 29b is removed (refer to FIG. 11(e)). In this case, in the etching of the part not covered by the second resist 29b, the residual piezoelectric film 25a left in the etching of the part not covered by the first resist 29a may be entirely etched.

On the other hand, the relative thickness of the residual piezoelectric film 25a may be the same as or greater than the relative thickness of the preliminary upper electrode 27 etched in the etching the part not covered by the second resist 29a. That is, when etching the residual piezoelectric film 25a and the preliminary upper electrode 27 in the same condition at the same time, the preliminary upper electrode 27 may be etched first or etched at the same time with the residual piezoelectric film 25a.

This is in order not to unnecessarily etch the preliminary upper electrode 27 in the etching of the preliminary upper electrode 27.

Also, in the etching of the part not covered by the second resist 29a, apart of the preliminary piezoelectric film 25, on which the large-area part 125b will be formed, may be partially etched. That is, the second resist 29a is formed to be extended in a longitudinal direction according to the pressure chambers 114 while considering the shape of the upper electrode 127 that will be formed later. Also, the upper electrode 127 may be formed to be extended in a longitudinal direction and to be provided in a plurality thereof, separate from one another with a certain distance in a widthwise direction therebetween. Since the second resist 29a is also formed to be plural separate from one another with a certain distance in a widthwise direction, a part not with the second resist 29a is formed between the adjacent second resists 29a. Accordingly, a part of the piezoelectric film 125, on which the large-area part 125b is formed, corresponding to the part not with the second resist 29a may be intentionally or unintentionally, additionally etched after all the preliminary upper electrode 27 on top is etched. Thus, the entire preliminary upper electrode 27 on the part not with the second resist 29a may be perfectly etched. Accordingly, the upper electrodes 127 respectively formed on the top of the plurality of pressure chambers 114 formed on the inkjet print head plate 110 may be separated from one another and individually provide driving force to the respective pressure chambers 114. On the other hand, an etched groove 125d may be formed on the part for forming the large-area part 125b of the piezoelectric film 125. The etched groove 125d may be formed to traverse the large-area part 125b in a longitudinal direction.

Throughout the processes, as shown in FIG. 11(e), the inkjet print head assembly 100 may be formed, in which the piezoelectric actuator 120 including the lower electrode 123, the piezoelectric film 125, and the upper electrode 127 is formed on the top of the inkjet print head plate 110.

According to the present embodiment, it is possible to provide a piezoelectric actuator capable of being easily connected to a flexible printed circuit (FPC) and reducing incidence of short circuit, an inkjet print head assembly, and a method of manufacturing the piezoelectric actuator and the inkjet print head assembly.

According to the present embodiment, it is possible to provide a piezoelectric actuator capable of reducing a defect ratio by compensating a disadvantage of exposing a common electrode that is a lower electrode in a process of manufacturing piezoelectric actuators, an inkjet print head assembly using the piezoelectric actuator, and a method of manufacturing the piezoelectric actuator and the inkjet print head assembly.

While the present invention has been shown and described in connection with the exemplary embodiments, it will be apparent to those skilled in the art that modifications and variations can be made without departing from the spirit and scope of the invention as defined by the appended claims.

What is claimed is:

1. A piezoelectric actuator comprising:
   upper electrodes, having a plurality of respective connection parts, and lower electrodes providing driving voltages, wherein
   each of the plurality of connection parts have a larger width than those of other parts of the upper electrodes, and
   the plurality of connection parts are disposed in different locations of the upper electrodes in a longitudinal direction;
   a piezoelectric film formed between the upper and lower electrodes and providing a driving force to ink in a plurality of pressure chambers formed on an inkjet print head, respectively, the piezoelectric film being a single body that comprises
   a plurality of basin parts individually formed on respective tops of the plurality of pressure chambers and
   a large-area part connected to each of the plurality of basin parts, respectively, at one end of each of the plurality of basin parts, the large-area part comprising a groove formed on an extended line of a basin line partitioning the basin parts.

2. The piezoelectric actuator of claim 1, wherein the groove is formed to traverse the large-area part in a longitudinal direction.

3. The piezoelectric actuator of claim 1, wherein the upper electrodes are individually formed, respectively, to be extended from the basin parts to the large-area part.

4. An inkjet print head assembly comprising:
   an inkjet print head plate in which an ink channel is formed; and
   a piezoelectric actuator formed to correspond to pressure chambers in the inkjet print head plate and providing a driving force for ejecting ink from the pressure chambers to nozzles,
   wherein the piezoelectric actuator comprises:
   upper electrodes, having a plurality of respective connection parts, and lower electrodes providing driving voltages, wherein
   each of the plurality of connection parts have a larger width than those of other parts of the upper electrodes, and
   the plurality of connection parts are disposed in different locations of the upper electrodes in a longitudinal direction;
   a piezoelectric film formed between the upper and lower electrodes and providing a driving force to ink in a plurality of pressure chambers formed on an inkjet print head, respectively, the piezoelectric film being a single body that comprises
   a plurality of basin parts individually formed on respective tops of the plurality of pressure chambers and
   a large-area part connected to each of the plurality of basin parts, respectively, at one end of each of the plurality of basin parts, the large-area part comprising a groove formed on an extended line of a basin line partitioning the basin parts.

5. The inkjet print head assembly of claim 4, wherein the groove is formed to traverse the large-area part in a longitudinal direction.

6. The inkjet print head assembly of claim 4, wherein the upper electrodes are individually formed, respectively, to be extended from the basin parts to the large-area part.

7. A piezoelectric actuator comprising:
   upper electrodes, having a plurality of respective connection parts, and lower electrodes providing driving voltages; and
   a piezoelectric film formed between the upper and lower electrodes and providing a driving force to ink in a plurality of pressure chambers formed on an inkjet print head, respectively, the piezoelectric film being a single body that comprises
   a plurality of basin parts individually formed on respective tops of the plurality of pressure chambers and
   a large-area part connected to each of the plurality of basin parts, respectively, at one end of each of the plurality of basin parts, the large-area part comprising a groove formed on an extended line of a basin line partitioning the basin parts.

* * * * *